June 7, 1966 R. DIDCHENKO ETAL 3,254,493

THERMOELECTRIC CONVERSION APPARATUS

Filed July 26, 1962 2 Sheets-Sheet 1

INVENTORS
ROSTISLAV DIDCHENKO
RICHARD T. DOLLOFF
FRANK P. GORTSEMA

BY John R Hoherty
ATTORNEY

June 7, 1966 R. DIDCHENKO ET AL 3,254,493

THERMOELECTRIC CONVERSION APPARATUS

Filed July 26, 1962 2 Sheets-Sheet 2

INVENTORS
ROSTISLAV DIDCHENKO
RICHARD T. DOLLOFF
FRANK P. GORTSEMA

BY John R. [signature]
ATTORNEY

United States Patent Office 3,254,493
Patented June 7, 1966

3,254,493

THERMOELECTRIC CONVERSION APPARATUS

Rostislav Didchenko, Cleveland, and Frank P. Gortsema and Richard T. Dolloff, Parma, Ohio, assignors to Union Carbide Corporation, a corporation of New York Filed July 26, 1962, Ser. No. 212,528
10 Claims. (Cl. 62—3)

The present invention relates generally to thermoelectric conversion processes and apparatus and, more particularly, to a new class of thermoelectric compositions for use in such processes and apparatus.

Heretofore, a number of criteria have been established for determining the qualtity of thermoelectric materials. One such criterion is the figure of merit, which is defined by the formula:

$$Z=\frac{\alpha^2\sigma}{K}$$

wherein $\alpha$ is the thermoelectric power (Seebeck coefficient) of the material, $\sigma$ is its electrical conductivity, and K is its thermal conductivity. For thermoelectric generating and freezing applications, a thermoelectric material with a relatively high figure of merit is generally preferred. Another criterion is the quantity ZT, wherein Z is the figure of merit and T is the absolute temperature at which the material is to operate. For an optimum thermoelectric material, the ZT value should be approximately unity. A further criterion for evaluating a thermoelectric material is the stability of the material at high temperatures. Since the efficiency of the thermoelectric power generator generally increases with increasing temperature, stability of the materials at relatively high temperatures usually permits more efficient operation.

It is, therefore, the main object of the present invention to provide a thermoelectric conversion process and apparatus wherein the thermoelectric materials have good figures of merit and are stable at high temperatures.

It is another object of the invention to provide a thermoelectric conversion process and apparatus wherein the thermoelectric materials have a good ZT value and are stable at high temperatures.

A further object of the invention is to provide a thermoelectric conversion process and apparatus wherein the thermoelectric materials are stable at temperatures as high as 2000° C.

Figure 1:
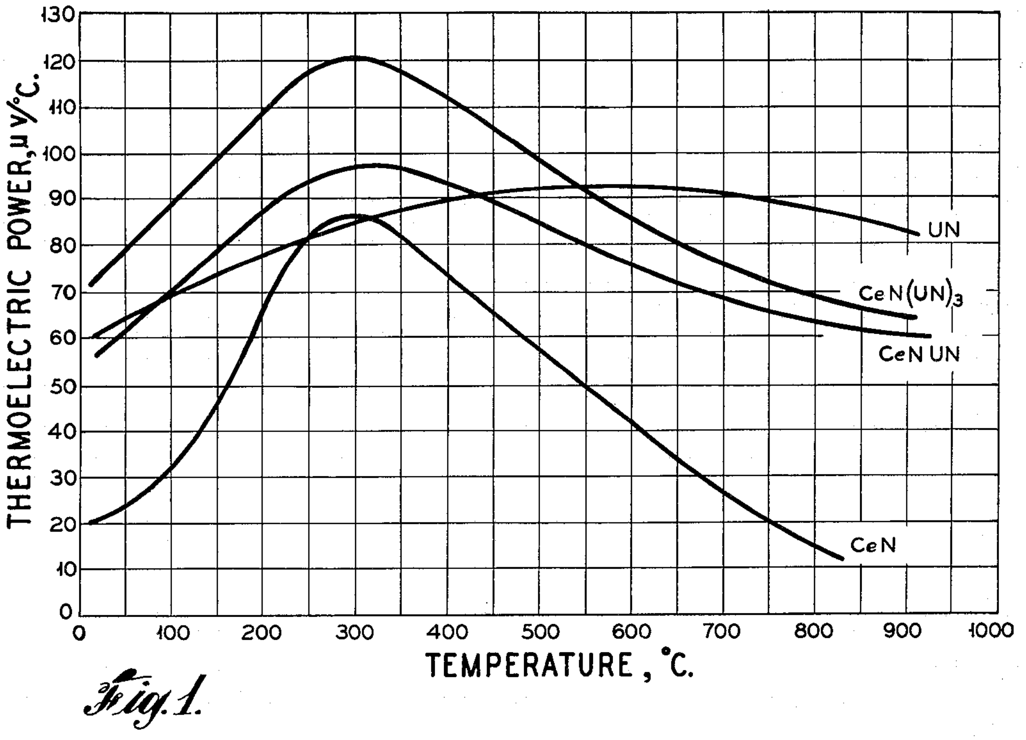
Figure 2:
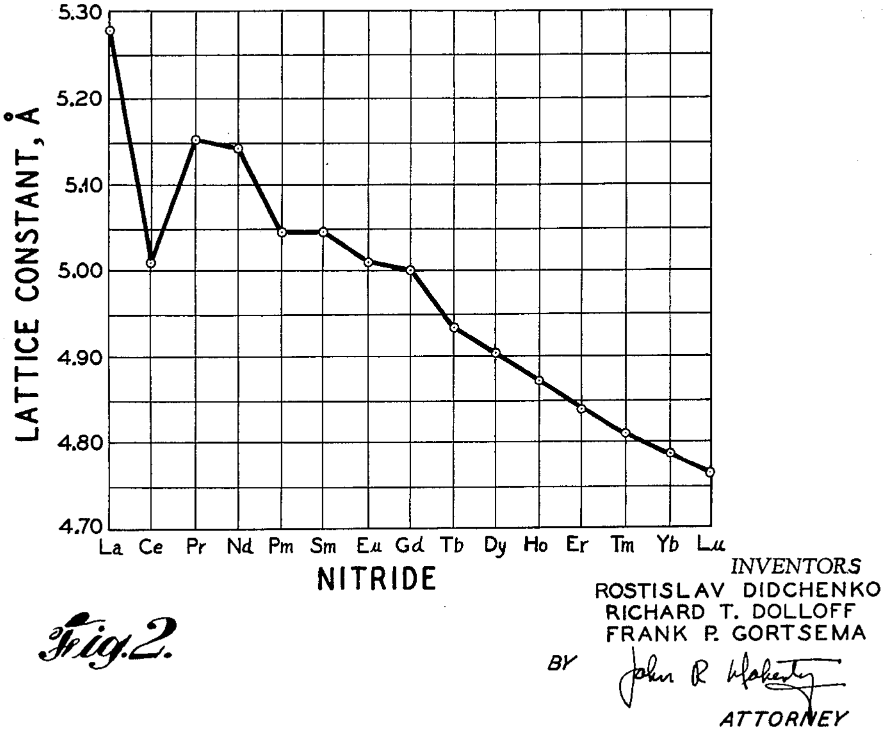
Figure 3:
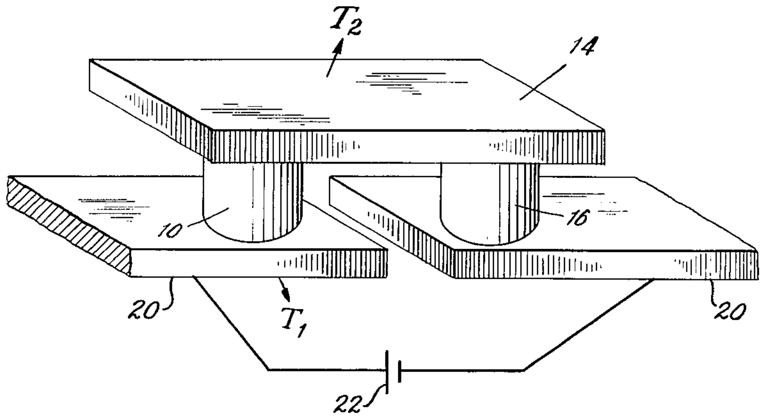

Further aims and advantages of the invention will be apparent from the following detailed description of preferred embodiments thereof taken in connection with the accompanying drawings, in which:

FIG. 1 is a graph showing the thermoelectric power of a few of the subject thermoelectric materials as a function of temperature; and FIG. 2 is a graph showing the lattice constants of the thermoelectric materials as a function of atomic number; and FIG. 3 is a schematic isometric view of a preferred embodiment of the present invention.

In accordance with the present invention, there is provided a novel thermoelectric device comprising at least one material selected from the group consisting of the nitrides of lanthanum, cerium, praseodynium, neodymium, promethium, samarium, europium, gadolinium, terbium, dysprosium, holmium, erbium, thulium, ytterbium, lutetium, actinium, thorium, protactinium, and uranium, in electrical contact with a material of opposite conductivity type at two or more junctions. The aforementioned nitrides may be used alone or in combination with each other. The electrical contacts may be made by a physical contact between the two materials or through an electrical conductor.

At least one of the dissimilar materials employed in the present invention is one or more nitrides of the lanthanide and actinide elements. As used herein, the term "lanthanide elements" refers to elements 57 through 71, and the term "actinide elements" refers to elements 89 through 92. At room temperature, the lanthanide and actinide nitrides have relatively low thermal conductivities ($10^{-2}$ to $5\times10^{-3}$ watt cm.$^{-1}$ ° K.$^{-1}$), relatively low thermoelectric powers (2 to 60 $\mu$v./° C.), and relatively high electrical conductivities (10 to $10^5$ ohm$^{-1}$ cm.$^{-1}$). However, the thermoelectric powers of both the lanthanide and actinide nitrides generally increase with increasing temperature sufficiently to improve the thermoelectric performance in spite of a slight increase in thermal conductivity and electrical resistivity with increasing temperature. The thermoelectric power ($\alpha$) and electrical resistivity ($\rho$) of several of the nitrides and nitride mixtures at room temperature (20–25° C.) are given in the following table:

| Composition | $\alpha$ ($\mu$v./° C.) | $\rho$ (ohm-cm.) |
|---|---|---|
| CeN | 21 | $4.0.10^{-5}$ |
| SmN | −6 | $1.8.10^{-4}$ |
| EuN | −17 | $1.0.10^{-3}$ |
| GdN | −19 | $2.9.10^{-4}$ |
| YbN | −11 | $1.7.10^{-2}$ |
| LuN | −17 | $5.3.10^{-4}$ |
| UN | 64 | $8.5.10^{-5}$ |
| $UN(CeN)_3$ | 70 | $1.9.10^{-4}$ |
| UNCeN | 62 | $5.5.10^{-4}$ |
| $(UN)_3CeN$ | 78 | $3.7.10^{-4}$ |
| LaN | −13 | $2.1.10^{-4}$ |
| HoN | −16 | $1.4.10^{-4}$ |

The figures given above are only for one particular sample of each nitride or nitride mixture and may vary slightly with the method of preparation or any heat treatment used. All the samples referred to in the above table were prepared by the same process.

The lanthanide and actinide nitrides are all n-type materials at room temperature except CeN and UN, which are p-type materials. The conductivity type of the lanthanide and actinide nitrides generally does not change with temperature.

Most of the lanthanide and actinide nitrides have relatively low figures of merit. For example, CeN has a figure merit of $1.7\times10^{-5}$/° K. at 1100° K. However, UN has a figure merit of $4.7\times10^{-4}$/° K. at 1300° K., giving a ZT value of 0.6. Moreover, the figure of merit of the lanthanide and actinide nitrides can usually be improved by mixing them with each other.

Referring to FIG. 1, the thermoelectric powers of CeN, UN, and two mixtures of CeN and UN have been plotted as a function of temperature. It can be seen from the curves that the maximum thermoelectric powers of the CeN-UN mixtures are higher than that of CeN alone. Also, the maximum thermoelectric powers of the CeN-UN mixtures are higher than that of UN alone, and the maximum occurs at a much lower temperature for the mixtures. Of course, these are only a few examples of the many nitride mixtures within the scope of the present invention.

Both the lanthanide nitrides and the actinide nitrides can be prepared by the reaction of the pure metal in finely divided form (or the hydrided metal) with ammonia in the absence of oxygen at 1000° C. Mixtures of the various nitrides can be prepared by mixing together the desired nitrides in powdered form (200 mesh particle size or smaller) and heating the powder mixture to 2000 to 2400° C. in an inert atmosphere. When YbN or EuN is employed, a lower sintering temperature (1300 to 1800° C.) should be employed to prevent volatization thereof. The lanthanide and actinide nitrides all have a dull metallic luster and crystallize in a cubic NaCl-type lattice. The lattice constants (A.) for the lanthanide nitrides are plotted in FIG. 2 as a function of the atomic numbers of the lanthanide elements. It can be seen from the curve that the lattice constants of the lanthanide nitrides vary only about 10% from LaN to LuN. The lattice constant for UN is about 4.89 A., which is within the range of lattice constants for the lanthanide nitrides. Since the lanthanide and actinide nitrides have such close lattice constants, it is possible to combine the various nitrides in binary and polycomponent solid solutions. Both the single nitrides and the nitride mixtures are stable in inert atmospheres, such as nitrogen, at temperatures as high as 2000° C.

The thermoelectric device is formed by contacting one of the aforedescribed nitrides or nitride mixtures with a material of opposite conductivity type at two or more junctions. In other words, if the particular nitride or nitride mixture employed is an n-type material, such as LaN, EuN, GdN, or LuN, it should be contacted with a p-type material, such as CeN, UN, $UN(CeN)_3$, UNCeN, or $(UN)_3CeN$. It is not necessary that both materials be nitrides or nitride mixtures. For example, the p-type nitrides could be contacted with a rare earth monosulfide or any other n-type material.

The electrical contacts between the dissimilar materials may be made either by direct sintering or through an electrical conductor or circuit. A preferred embodiment of the inventive thermoelectric device is shown in FIG. 3. Referring now to FIG. 3, a disc 10 consisting of one of the aforedescribed nitrides or nitride mixtures and a disc 16 of opposite conductivity type are in electrical contact through an intermediate electrical conductor 14 joined to the upper ends of the two discs 10 and 16. The conductor 14 may be any electrically conductive material, such as platinum or nickel, and may be joined to the discs 10 and 16 by a conductive solder. The lower ends of the discs 10 and 16 are connected to a suitable impedance or power source (not shown). The thermoelectric circuit may be used for power generation and refrigeration or heat pumping. For refrigeration or heat pumping, a D.C. power supply 22 is connected between the two electrodes 20, and the temperature of one of the junctions becomes greater than the temperature of the other junction, depending on the polarity of the applied voltage. In other words, with an applied voltage of one polarity, $T_2$ is higher than $T_1$, and with the other polarity, $T_1$ is higher than $T_2$. For power generation, the D.C. power supply is replaced by an impedance (such as a load resistance) which is connected between the electrodes 20, and heat is applied to the conductor 14. Under steady state conditions, the heat supplied to the conductor 14 produces a temperature difference $T_2-T_1$ which results in power generation at the electrodes 20.

While various specific forms of the present invention have been illustrated and described herein, it is not intended to limit the invention to any of the details herein shown.

What is claimed is:

1. A thermoelectric device comprising: a first material comprising at least one nitride selected from the group consisting of the nitrides of the lanthanide and actinide elements in electrical contact with a second material of opposite conductivity type at two or more junctions.

2. A thermoelectric device comprising: a first material comprising at least one nitride selected from the group consisting of the nitrides of lanthanum, cerium, samarium, europium, gadolinium, holminum, ytterbium, lutetium, and uranium in electrical contact with a second material of opposite conductivity type at two or more junctions.

3. A thermoelectric device comprising a material consisting of CeN and UN in electrical contact with an n-type material at two or more junctions.

4. A thermoelectric device comprising a material characterized by the formula $UN(CeN)_3$ in electrical contact with an n-type material at two or more junctions.

5. A thermoelectric device comprising a material characterized by the formula UNCeN in electrical contact with an n-type material at two or more junctions.

6. A thermoelectric device comprising a material characterized by the formula $(UN)_3CeN$ in electrical contact with an n-type material at two or more junctions.

7. A thermoelectric generator comprising a thermoelectric element comprising at least one nitride selected from the group consisting of the nitrides of the lanthanide and actinide elements in electrical contact with a second thermoelectric element comprising a material of opposite conductivity type from said nitride at a first low-resistance junction, said nitride and said material of opposite conductivity type being electrically connected at a second junction through a load impedance, and means for supplying heat to said first junction.

8. A thermoelectric generator comprising an electrical conductor; a first thermoelectric element comprising at least one nitride selected from the group consisting of the nitrides of the lanthanide and actinide elements connected to said conductor; a second thermoelectric element comprising at least one material of opposite conductivity type from said nitride connected to said conductor; and a load impedance connected between said nitride and said material of opposite conductivity type at points spaced away from said conductor.

9. A thermoelectric heat pump comprising a thermoelectric element comprising at least one nitride selected from the group consisting of the nitrides of the lanthanide and actinide elements in electrical contact with a second thermoelectric element comprising a material of opposite conductivity type from said nitride at a first low-resistance junction, said nitride and said material of opposite conductivity type being electrically connected at a second junction through a D.C. voltage source.

10. A thermoelectric heat pump comprising an electrical conductor; a first thermoelectric element comprising at least one nitride selected from the group consisting of the nitrides of the lanthanide and actinide elements connected to said conductor; a second thermoelectric element comprising at least one material of opposite conductivity type from said nitride connected to said conductor; and means for applying a D.C. voltage across said nitride and said material of opposite conductivity type at points spaced away from said conductor.

References Cited by the Examiner

UNITED STATES PATENTS 3,009,977 11/61 Houston ---------------- 136—5

OTHER REFERENCES

Breckinridge, R. G., "(NP-12083) Thermoelectric Materials. Final Report, January 28, 1959–July 28, 1960." Dated August 15, 1960.

Warren, et al., "Measurement of Thermoelectric Power and Thermal Conductivity in Semiconductor Compounds." In "(NP-11410) Canadian Uranium Research Foundation Progress Report No. 3." September 1961, 28 pp.

WINSTON A. DOUGLAS, *Primary Examiner.*

JOHN H. MACK, *Examiner.*

A. M. BEKELMAN, *Assistant Examiner.*